United States Patent
Onishi et al.

(10) Patent No.: US 10,263,398 B2
(45) Date of Patent: Apr. 16, 2019

(54) DIRECT-CURRENT DISTRIBUTION PANEL AND MIGRATION DEVICE

(71) Applicant: Mitsubishi Electric Corporation, Chiyoda-ku, Tokyo (JP)

(72) Inventors: Kenji Onishi, Tokyo (JP); Munetsugu Sakamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/749,678

(22) PCT Filed: Nov. 2, 2016

(86) PCT No.: PCT/JP2016/082570
§ 371 (c)(1),
(2) Date: Feb. 1, 2018

(87) PCT Pub. No.: WO2017/094428
PCT Pub. Date: Jun. 8, 2017

(65) Prior Publication Data
US 2018/0233885 A1  Aug. 16, 2018

(30) Foreign Application Priority Data

Nov. 30, 2015  (JP) .................................. 2015-232554

(51) Int. Cl.
*H02B 1/04* (2006.01)
*H05K 7/14* (2006.01)
(Continued)

(52) U.S. Cl.
CPC ............... *H02B 1/04* (2013.01); *H02B 1/052* (2013.01); *H02B 1/42* (2013.01); *H02J 3/02* (2013.01); *H05K 7/1492* (2013.01)

(58) Field of Classification Search
CPC . H02B 1/04; H02B 1/052; H02B 1/42; H05K 7/18; H05K 7/1492; H05K 7/1457
(Continued)

(56) References Cited

U.S. PATENT DOCUMENTS 6,205,029 B1 * 3/2001 Byrne .................. H05K 7/1457
174/68.2
7,400,062 B2 * 7/2008 Pincu ...................... H02J 1/102
307/29
(Continued)

FOREIGN PATENT DOCUMENTS

JP  2003-264385 A  9/2003
JP  2006-246547 A  9/2006
(Continued)

OTHER PUBLICATIONS

Written Opinion (PCT/ISA/237) dated Jan. 31, 2017, by the Japanese Patent Office as the International Searching Autnority tor International Application No. PCT/JP2016/082570.

*Primary Examiner* — Zachary Pape
(74) *Attorney, Agent, or Firm* — Buchanan Ingersoll & Rooney PC

(57) ABSTRACT

A DC distribution panel unit and a migration device are stored in a DC distribution panel. The migration device and the DC distribution panel unit are configured to be compatible with each other in terms of a structure and a position of connection to a power supply of the DC distribution panel, a structure and a position of connection to loads, and a fixation position of fixation to the panel. The migration device and the DC distribution panel unit are replaceable with each other.

7 Claims, 8 Drawing Sheets

(51) Int. Cl.
  *H02B 1/42*  (2006.01)
  *H02J 3/02*  (2006.01)
  *H02B 1/052*  (2006.01)

(58) Field of Classification Search
  USPC .................................................. 361/600–678
  See application file for complete search history.

(56) References Cited

U.S. PATENT DOCUMENTS

| | | | |
|---|---|---|---|
| 9,030,042 B2* | 5/2015 | Zhan | H02J 1/06 |
| | | | 307/31 |
| 9,377,832 B1* | 6/2016 | Heydari Monfared | ...................... |
| | | | H05K 7/1457 |
| 9,622,373 B1* | 4/2017 | Sarti | H05K 7/1492 |
| 9,723,742 B2* | 8/2017 | Steeves | H02B 1/205 |
| 9,733,682 B2* | 8/2017 | Butzer | G06F 1/26 |
| 2016/0094089 A1* | 3/2016 | Bailey | H05K 7/1492 |
| | | | 307/66 |
| 2016/0189902 A1 | 6/2016 | Sangawa et al. | |
| 2017/0300100 A1* | 10/2017 | Takeuchi | G06F 1/266 |

FOREIGN PATENT DOCUMENTS

| | | |
|---|---|---|
| JP | 2008-253120 A | 10/2008 |
| JP | 2010-178572 A | 8/2010 |
| JP | 2011-101527 A | 5/2011 |
| JP | 2014-204631 A | 10/2014 |
| WO | WO 2015/029528 A1 | 3/2015 |

\* cited by examiner

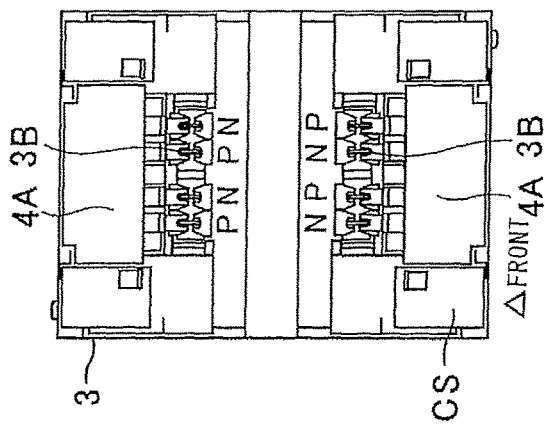
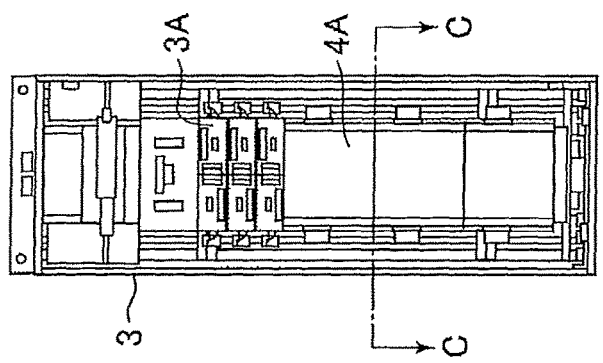
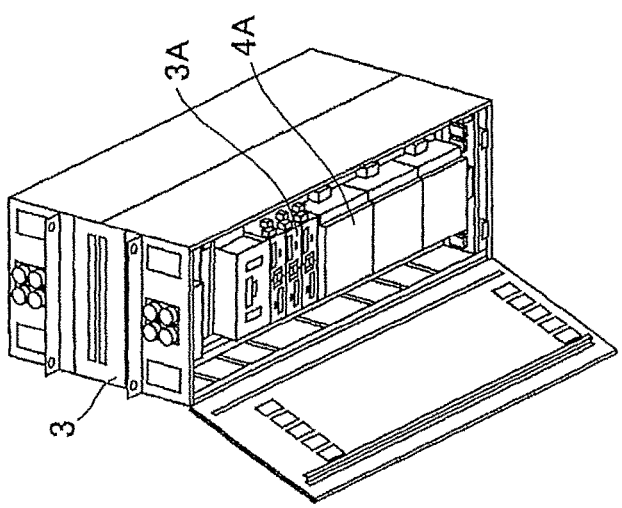

DIRECT-CURRENT DISTRIBUTION PANEL AND MIGRATION DEVICE

TECHNICAL FIELD

The present invention relates to a DC distribution panel and a migration device for supplying power to electronic devices such as an exchange device and an optical fiber termination device.

BACKGROUND ART

In recent years, servers and information communication devices have been widely spreading to support a social infrastructure, but the power consumption thereof increases and the need for reducing this increases. Therefore, in the field of telecommunications carriers and data center operators, the following DC power feeding system is known. An AC power supply is converted to high voltage of, for example, DC 380 volts (hereinafter, referred to as DC 380 V) to supply power with high voltage, whereby load current is decreased and thin wires can be used. Thus, the installation cost can be reduced. In addition, by adapting loads to DC 380 V and to high voltage DC power feeding, power loss due to DC/AC conversion and DC/DC conversion is reduced, whereby energy saving is achieved.

In this field, servers and communication equipment which are loads are being increasingly adapted to DC 380 V. However, for example, in the case where there are AC loads such as an air conditioner, fire-fighting equipment, and an existing server that cannot be adapted to DC 380 V, power of DC 380 V is converted to AC power by a DC/AC conversion device and the AC power is supplied to these loads. In addition, in the case where there are loads such as DC-48-V loads and DC-12-V loads other than DC-380-V loads, power of DC 380 V is converted to voltages adapted to the respective loads by DC/DC conversion devices, and the converted voltages are supplied. In particular, in this field, the DC/AC conversion device and the DC/DC conversion device are called migration devices.

One example of such devices is disclosed in Patent Document 1. In Patent Document 1, an electronic device having a circuit configuration shown in FIG. 3 of Patent Document 1 is mounted, as shown in FIG. 4, in an electronic device storage box in which electronic devices such as an exchange device and an optical fiber termination device are to be mounted.

As shown in Patent Document 1, conventional standard electronic device storage boxes are storage boxes of JIS standard and EIA standard which are called 19-inch rack.

A migration device 4 formed with a 19-inch rack as an electronic device storage box shown in FIG. 4 of Patent Document 1 is configured as shown in, for example, FIG. 1B of the drawings of the present application. The electronic device storage box is composed of a pair of box bodies, and one of the box bodies stores: communication electronic devices EM (DC) of DC-driven type such as a router and a switching hub; a DC/AC converter CV (AC) of AC-driven type; and a rectifier RF for performing DC power feeding. The other box body stores: communication electronic devices EM (AC) of AC-driven type such as a firewall; and four servers SV (DC) of DC-driven type.

As shown in FIG. 3 of Patent Document 1, a commercial power supply is converted to DC power through AC/DC conversion, and then the DC power is directly supplied to DC loads, and meanwhile, for AC loads, the DC power is converted into AC power through DC/AC conversion and the AC power is supplied to the AC loads. Even in the case of DC loads, if, for example, a power supply is DC 100 V but the load is adapted to DC 48 V, the power supply is converted to DC 48 V through DC/DC conversion in accordance with the load, and the converted power is supplied to the load.

In the case where a plurality of loads are connected to the load side of a rectifier 2 as shown in FIGS. 1A and 1B of the drawings of the present application, there is known a system of supplying power to the loads via a distribution panel provided with a wiring circuit breaker and a fuse as shown in Patent Document 2.

CITATION LIST

Patent Document

Patent Document 1: Japanese Laid-Open Patent Publication No. 2003-264385 (FIG. 3, FIG. 4)
Patent Document 2: International Publication No. WO2015/029528A1 (FIG. 1)

SUMMARY OF THE INVENTION

Problems to be Solved by the Invention

In the conventional configuration using a 19-inch rack as shown in Patent Document 1, DC/AC converters and DC/DC converters are stored in the 19-inch rack as shown in FIG. 4. Therefore, for example, as shown in FIGS. 1A and 1B of the drawings of the present application, in a system in which power is supplied via a DC distribution panel 3 of DC 380 V to, besides loads 5C of DC 380 V, migration devices 4A, 4B of a 19-inch rack 4 and thereby powers are supplied to a load 5A of AC 100 V and a load 5B of DC 48 V, if some of the loads of the migration devices 4A, 4B have become adaptable to DC 380 V and thus are to be replaced, it is necessary to newly provide a DC distribution panel 3S for DC 380 V to supply power as shown in FIG. 2 of the drawings of the present application.

Further, if all the migration loads have become adaptable to DC 380 V, it is necessary to newly provide a DC distribution panel 3S and in addition, it is necessary to dispose of the 19-inch rack 4 that have been storing the migration devices 4A, 4B. This is not cost-effective.

In FIGS. 1A and 1B of the drawings of the present application, DC power obtained by converting the commercial power supply 1 to DC 380 V by the rectifier 2 including an AC/DC converter 2A and a battery 2B is supplied to the DC distribution panel 3.

The present invention has been made to solve the above problem, and an object of the present invention is to achieve cost reduction and space saving by exchanging a migration device with a DC distribution panel unit when a load of the migration device has become adapted to high voltage DC power feeding.

Solution to the Problems

In the present invention, a DC distribution panel unit and a migration device are stored in a DC distribution panel, the migration device and the DC distribution panel unit are configured to be compatible with each other in terms of a structure and a position of connection to a power supply of the DC distribution panel, a structure and a position of connection to a load, and a fixation position of fixation to the panel, so that the migration device and the DC distribution panel unit are replaceable with each other.

Effect of the Invention

According to the present invention, migration devices are stored in the DC distribution panel, and even if some of migration loads have become adapted to high voltage DC power feeding, the corresponding migration devices are replaced with DC distribution panel units. Thus, it becomes possible to address the load change without newly adding a DC distribution panel. Thus, a system that is cost-effective and achieves space saving can be realized.

BRIEF DESCRIPTION OF THE DRAWINGS

FIGS. 5A to 5C show a general configuration of a DC distribution panel, in which FIG. 5A is a perspective view, FIG. 5B is a front view, and FIG. 5C is a C-C sectional view.

FIGS. 6A to 6D show the configuration of a DC distribution panel unit, in which FIG. 6A is a perspective view of a left unit, FIG. 6B is a perspective view of a right unit, FIG. 6C is a front view of the left unit, and FIG. 6D is a side view of the left unit.

FIGS. 7A to 7C show the configuration of the DC distribution panel of the present invention, in which FIG. 7A is a perspective view, FIG. 7B is a front view, and FIG. 7C is a C-C sectional view.

FIGS. 8A to 8C show the configuration of a migration device of embodiment 1 according to the present invention, in which FIG. 8A is a perspective view, FIG. 8B is a front view, and FIG. 8C is a side view.

FIGS. 9A and 9B show a migration device of embodiment 2 according to the present invention, in which FIG. 9A is a perspective view of a left-side migration device and FIG. 9B is a perspective view of a right-side migration device.

DESCRIPTION OF EMBODIMENTS

Embodiment 1

Figure 1A:
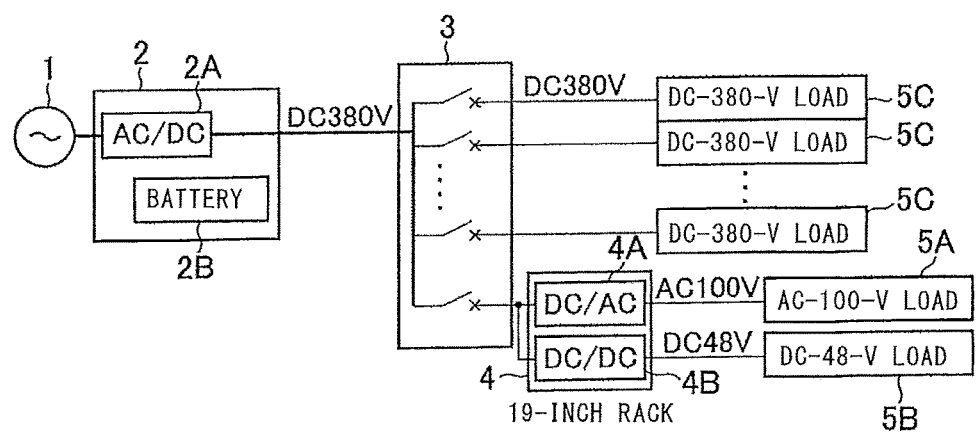
FIG. 1A is a block diagram showing a general configuration of a DC distribution panel and loads.
Figure 1B:
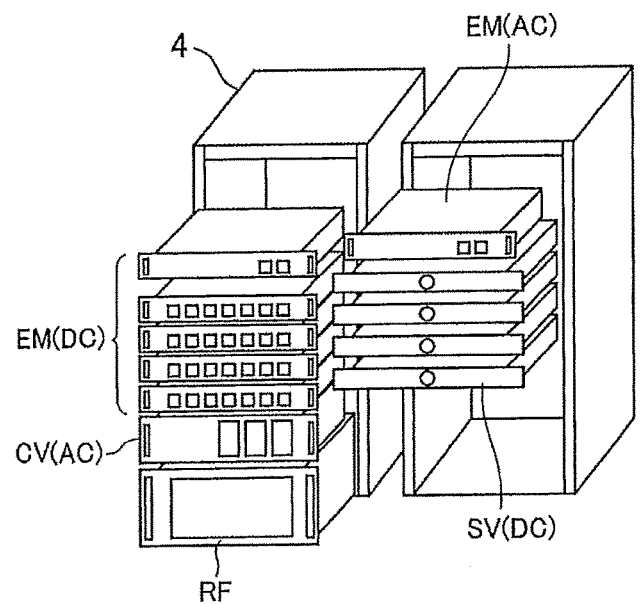
FIG. 1B is a perspective view showing the configuration of a migration device formed with a 19-inch rack.
Figure 2:
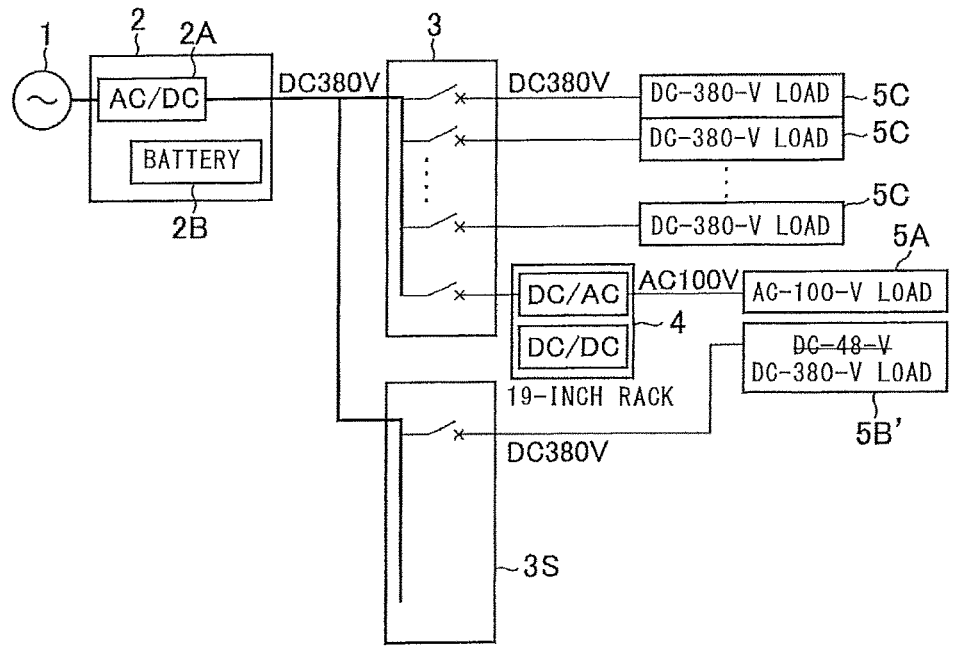
FIG. 2 is a block diagram showing the configuration in the case where some of the loads have become adapted to DC 380 V.
Figure 3:
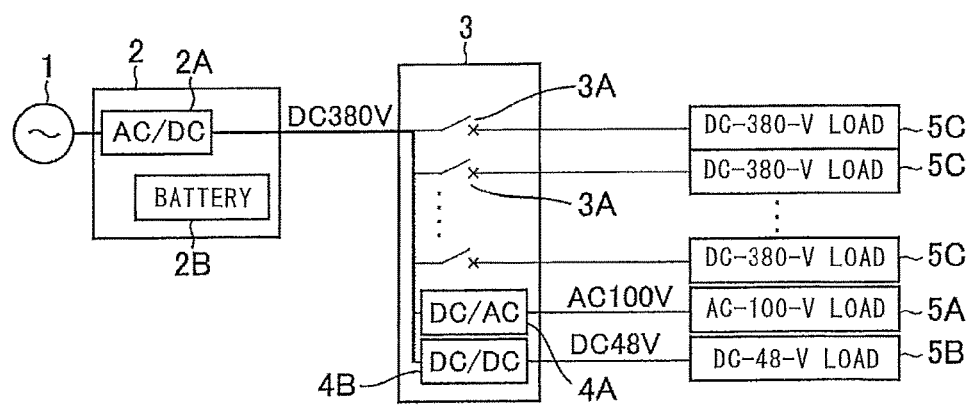
FIG. 3 is a block diagram showing the configuration of the present invention in which migration devices are stored in a DC distribution panel.
Figure 4:
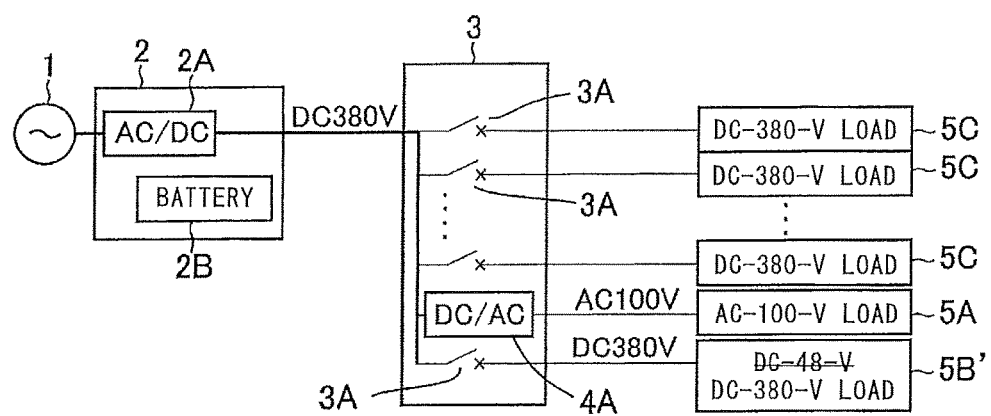
FIG. 4 is a block diagram showing the configuration of the present invention in the case where some of loads have become adapted to DC 380 V.

Embodiment 1 according to the present invention will be described with reference to FIGS. 1A to 8C. FIG. 1A is a block diagram showing a general configuration of a DC distribution panel and loads. FIG. 1B is a perspective view showing the configuration of a migration device formed with a 19-inch rack. FIG. 2 is a block diagram showing the configuration in the case where some of the loads have become adapted to DC 380 V. FIG. 3 is a block diagram showing the configuration of the present invention in which migration devices are stored in a DC distribution panel. FIG. 4 is a block diagram showing the configuration of the present invention in the case where some of loads have become adapted to DC 380 V.

As described above, in a general configuration of a DC distribution panel and loads as shown in FIG. 1, if some of the loads have become adapted to high voltage DC power feeding and thus have become adapted to DC 380 V, in the conventional device, it is necessary to newly provide a DC distribution panel 3S adapted to DC 380 V as shown in FIG. 2 while leaving, in the 19-inch rack configured as shown in FIG. 1B, some migration devices corresponding to the loads that have become adapted to DC 380 V.

In the present invention, as shown in FIG. 3, migration devices 4A, 4B are stored in a DC distribution panel 3 together with DC distribution panel units 3A. DC power obtained by converting a commercial power supply 1 to DC 380 V by a rectifier 2 including an AC/DC converter 2A and a battery 2B is supplied to the DC distribution panel 3.

Here, the loads of the migration devices are communication electronic devices such as a router, a switching hub, a firewall, and a server which are stored in the 19-inch rack shown in FIG. 1B, and other electric equipment such as an air conditioner and a light which are not stored in the 19-inch rack, and these loads cannot be used directly with power of DC 380 V supplied from the DC distribution panel.

In the configuration of the present invention, if some of the loads have become adapted to high voltage DC power feeding and thus have become adapted to DC 380 V, as shown in FIG. 4, the migration device 4B is replaced with a DC distribution panel unit 3A. Thus, it is possible to address the load change without newly adding a DC distribution panel.

As described in detail below, the migration devices 4A, 4B and the DC distribution panel units 3A are configured to be compatible with each other in terms of (1) the structure of connection to a power supply of the DC distribution panel 3, (2) the position of connection to the power supply of the DC distribution panel 3, (3) the structure of connection to the loads 5A to 5C, (4) the position of connection to the loads 5A to 5C, and (5) the fixation position of fixation to the panel body of the DC distribution panel 3, so that the migration devices 4A, 4B and the DC distribution panel units 3A are replaceable with each other.

Figure 5C:
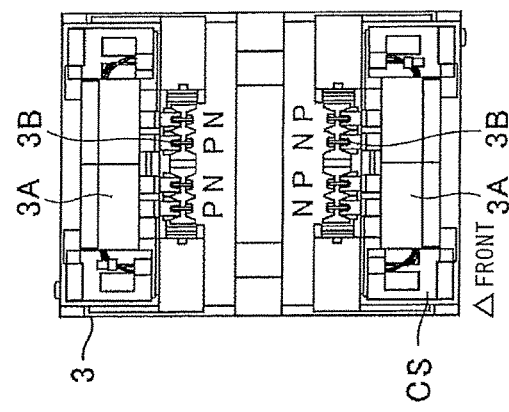
Figure 5B:
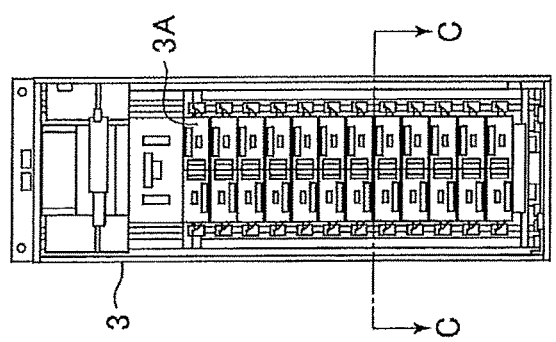
Figure 5A:
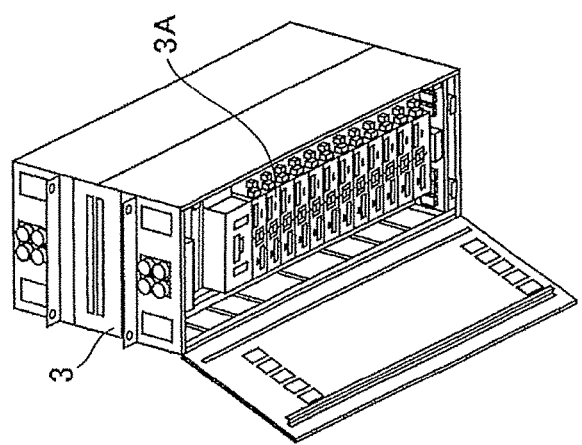
Figure 8A:
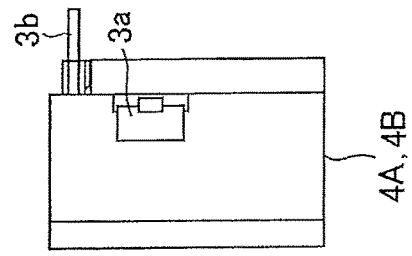
Figure 8B:
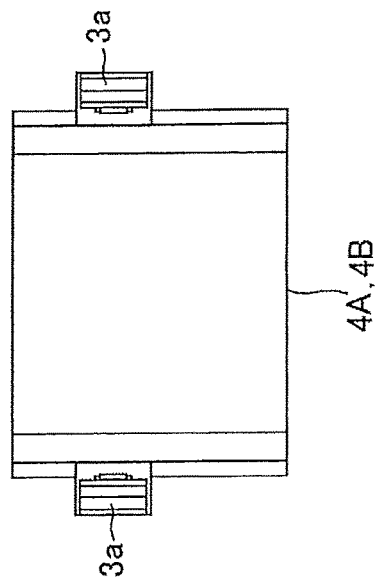
Figure 8C:
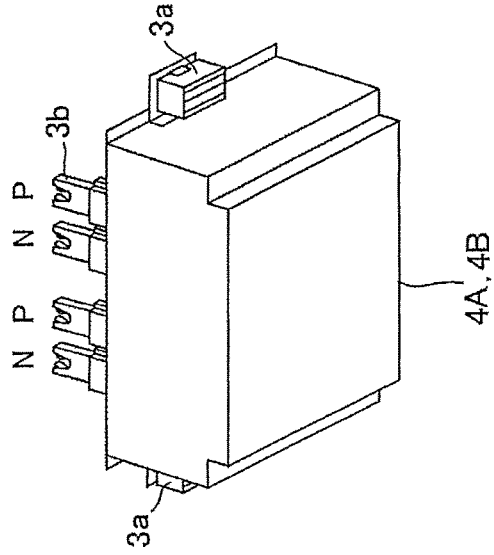

FIGS. 5A to 5C show a general configuration of the DC distribution panel. FIGS. 6A to 6D show the configuration of the DC distribution panel unit. FIGS. 7A to 7C show the configuration of the DC distribution panel of the present invention. FIGS. 8A to 8C show the configuration of the migration device of embodiment 1 according to the present invention.

First, FIGS. 5A to 5C show an example of a general structure of the DC distribution panel. FIG. 5A is a perspective view of a DC distribution panel 1. FIG. 5B is a front view of the DC distribution panel 1. The DC distribution panel units 3A are stored symmetrically between left and right with respect to the center line as shown in a sectional view of FIG. 5C.

Figure 6A:
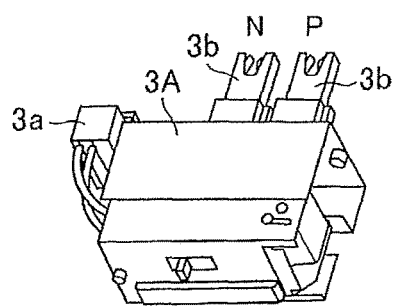
Figure 6B:
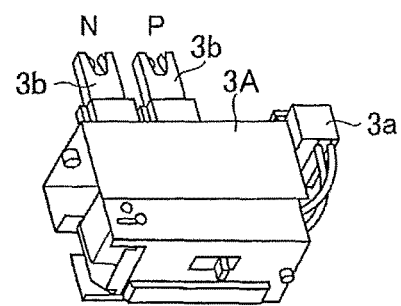

FIGS. 6A to 6D show the DC distribution panel units 3A. FIG. 6A is a perspective view of a left unit and FIG. 6B is a perspective view of a right unit. The DC distribution panel units 3A shown in FIG. 6A and FIG. 6B are configured symmetrically between left and right with respect to the center line of the front view in FIG. 5B.

Both of the left and right ones of the DC distribution panel units 3A have power supply contactors 3b to be electrically connected to two pairs of (four, in total) DC distribution panel vertical buses 3B for N phase, P phase, and N phase, P phase, respectively, as shown in the sectional view of FIG. 5C.

Figure 6C:
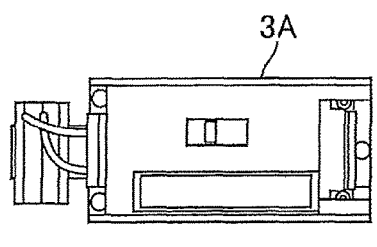
Figure 6D:
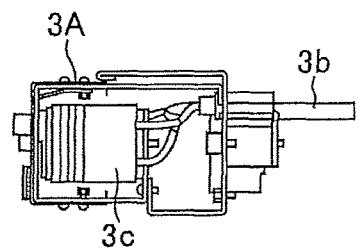

FIG. 6C is a front view of the left unit and FIG. 6D is a side view of the left unit. A wiring circuit breaker 3c is connected to the DC distribution panel vertical bus 3B via the power supply contactor 3b, and power is supplied to the load via a load terminal block 3a.

As shown in the sectional view of FIG. 5C, the DC distribution panel units 3A are stored on the front side and the back side in the panel.

Next, an example of the structure of the DC distribution panel of the present invention will be described with reference to FIGS. 7A to 7C. FIG. 7A is a perspective view of the DC distribution panel 3 in which the migration devices 4A, 4B are stored, and FIG. 7B is a front view of the DC distribution panel 3. Three stages of the DC distribution panel units 3A are stored on the upper side, and three migration devices 4A, 4B are stored so as to be stacked in the vertical direction on the lower side of the housing. The width in the vertical direction of each migration device 4A, 4B coincides with the width in the vertical direction of three stages of the DC distribution panel units 3A. Thus, the dimensions are set such that one migration device is accommodated in the space for three stages in the DC distribution panel 3 storing the DC distribution panel units 3A at respective stages.

As shown in the sectional view of FIG. 7C, the migration devices 4A, 4B are stored on the front side and the back side in the panel. In the example shown in FIG. 7, six migration devices 4A, 4B are stored in total.

When the migration devices 4A, 4B are stored in the DC distribution panel 3, the migration devices 4A, 4B are fixed to the panel structure body that is the housing of the DC distribution panel 3. The position of the fixation thereof is the same as in the case where the DC distribution panel units 3A are fixed. Thus, it is ensured that the DC distribution panel units 3A and the migration devices 4A, 4B are compatible with each other in terms of the fixation position of fixation to the panel structure body of the DC distribution panel 3.

The dimension in the vertical direction of the migration device 4A, 4B which is stored in the DC distribution panel 3 and fixed at the same plane position as in the case where the DC distribution panel units 3A are stored, is set to be an integer multiple of the dimension of each of the DC distribution panel units 3A. In this example, the dimension in the vertical direction of the migration device 4A, 4B is three times the dimension of each of the DC distribution panel units 3A. However, the dimension in the vertical direction of the migration device 4A, 4B may be the same as the dimension of each of the DC distribution panel units 3A.

FIGS. 8A to 8C show the details of the migration devices 4A, 4B. FIG. 8A is a perspective view of the migration device 4A, 4B, FIG. 8B is a front view of the migration device 4A, 4B, and FIG. 8C is a side view of the migration device 4A, 4B.

The migration devices 4A, 4B have power supply contactors 3b to be electrically connected to the DC distribution panel vertical buses 3B as shown in FIGS. 8A, 8B, 8C. DC/AC conversion or DC/DC conversion is performed in the migration device 4A and power is supplied to the load via the load terminal block 3a.

The power supply contactors 3b provided to the migration devices 4A, 4B have the same connection structure as the power supply contactors 3b provided to the DC distribution panel units 3A, and the positions of their connections to the DC distribution panel vertical buses 3B are also the same as those for the DC distribution panel units 3A. Thus, it is ensured that the DC distribution panel units 3A and the migration devices 4A, 4B are compatible with each other in terms of the structure of connection to the DC distribution panel vertical buses 3B which are the power supply of the DC distribution panel 3, and the position of connection to the DC distribution panel vertical buses 3B which are the power supply of the DC distribution panel 3.

The positional relationship of the migration devices 4A, 4B with the DC distribution panel vertical buses 3B when the migration devices 4A, 4B are stored in the panel structure body that is the housing of the DC distribution panel 3 is the same as in the case of the DC distribution panel units 3A.

The load terminal blocks 3a provided to the migration devices 4A, 4B also have the same connection structure as the load terminal blocks 3a provided to the DC distribution panel units 3A. The positions of their connections to the loads 5A to 5C are also the same as those of the DC distribution panel units 3A, and the load terminal blocks 3a are placed in wiring spaces CS formed at the left and right spaces of each migration device 4A, 4B. Thus, it is ensured that the DC distribution panel units 3A and the migration devices 4A, 4B are compatible with each other in terms of the structure of connection to the loads 5A to 5C and the position of connection to the loads 5A to 5C.

As described above, the migration devices 4A, 4B and the DC distribution panel units 3A are configured to be compatible with each other in terms of the structure and position of connection to the power supply of the DC distribution panel, the structure and position of connection to the loads, and the fixation position of fixation to the panel, so that the migration devices 4A, 4B are replaceable with the normally used DC distribution panel units 3A shown in FIG. 5.

Embodiment 2

Figures 9A, 9B:
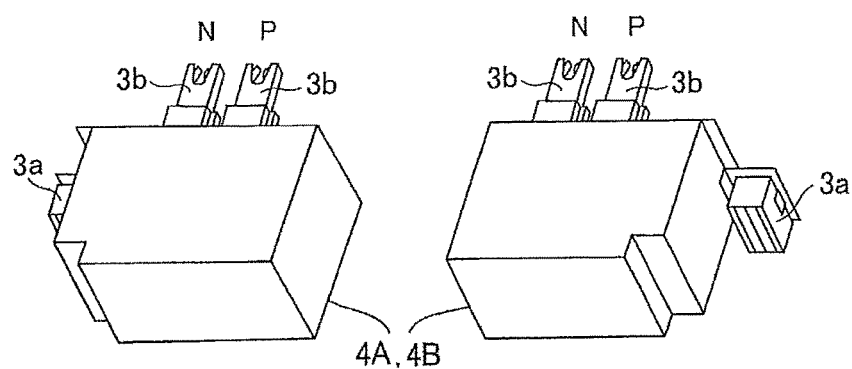

Embodiment 1 according to the present invention will be described with reference to FIGS. 9A and 9B.

In the size example in embodiment 1 shown in FIGS. 7A to 7C, one migration device is replaceable with six DC distribution panel units (three left units and three right units). However, as shown in FIGS. 9A and 9B, the migration devices may be one by one replaceable with each of the right and left ones of the DC distribution panel units 3A.

In embodiment 1 shown in FIG. 7, the width in the vertical direction of each migration device is three times the width in the vertical direction of each DC distribution panel unit 3A. As long as the width in the vertical direction of each migration device is an integer multiple of the width in the vertical direction of each DC distribution panel unit 3A, replacement thereof can be smoothly performed.

As described above, with the structure of the present invention, even if some of communication electronic devices such as a router, a switching hub, a firewall, and a server and other electric equipment such as an air conditioner and a light which are loads of the migration devices have become adapted to DC 380 V, the corresponding migration devices 4 are replaced with the DC distribution panel units 3A. Thus, it is possible to address the load change without newly adding a DC distribution panel 1. At the same time, it is possible to exclude the 19-inch rack shown in FIGS. 1A, 1B, and 2 from the system configuration. Thus, the cost for additionally providing a DC distribution panel 1 due to load change and the cost for providing the 19-inch rack can be eliminated. In addition, the cost for disposing of the 19-inch rack which will be unnecessary when all the loads have become adapted to DC 380 V in the future, is also not needed.

In addition, a space for placing the 19-inch rack is also not needed, and thus it is possible to realize a system that is cost-effective and achieves space saving.

It is noted that, within the scope of the present invention, the above embodiments may be, in whole or in part, freely combined with each other, or each of the above embodiments may be modified or simplified as appropriate.

DESCRIPTION OF THE REFERENCE CHARACTERS

1 commercial power supply
2 rectifier
3 DC distribution panel
3A DC distribution panel unit
3B DC distribution panel vertical bus
3a load terminal block
3b power supply contactor
3c wiring circuit breaker
4A migration device
4B migration device

The invention claimed is:

1. A DC distribution panel in which a DC distribution panel unit and a migration device are stored, the migration device and the DC distribution panel unit being configured to be compatible with each other in terms of a structure and a position of connection to a power supply of the DC distribution panel, a structure and a position of connection to a load, and a fixation position of fixation to the panel, so that the migration device and the DC distribution panel unit are replaceable with each other.

2. The DC distribution panel according to claim 1, wherein
a width in a vertical direction of the migration device is an integer multiple of a width in the vertical direction of the DC distribution panel unit.

3. The DC distribution panel according to claim 1, wherein
a width in a vertical direction of the migration device is the same as a width in the vertical direction of the DC distribution panel unit.

4. A migration device having a width that is an integer multiple of a width in a vertical direction of a DC distribution panel unit, the migration device being configured to be compatible with the DC distribution panel unit in terms of a structure and a position of connection to a power supply of a DC distribution panel, a structure and a position of connection to a load, and a fixation position of fixation to the panel.

5. The migration device according to claim 4, comprising:
a power supply contactor electrically connectable to a bus of the DC distribution panel; and
a terminal block for load connection.

6. The migration device according to claim 4, the migration device being replaceable with the DC distribution panel unit and compatible therewith in attachment, and being configured to allow two of the migration devices to be arranged side by side at left and right when being stored in the DC distribution panel.

7. The migration device according to claim 5, the migration device being replaceable with the DC distribution panel unit and compatible therewith in attachment, and being configured to allow two of the migration devices to be arranged side by side at left and right when being stored in the DC distribution panel.

* * * * *